United States Patent
Poon (10) Patent No.: US 10,237,975 B2
(45) Date of Patent: *Mar. 19, 2019

(54) METHOD OF MAKING TRANSPARENT CONDUCTIVE ELECTRODES COMPRISING MERGED METAL NANOWIRES

(71) Applicant: Nuovo Film Inc., Suzhou, Jiangsu (CN)

(72) Inventor: Hakfei Poon, Mountain View, CA (US)

(73) Assignee: NUOVO FILM INC., Suzhou, Jiangsu (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,413

(22) Filed: Feb. 16, 2018

(65) Prior Publication Data
US 2018/0177048 A1    Jun. 21, 2018

Related U.S. Application Data

(63) Continuation of application No. 14/360,896, filed as application No. PCT/CN2014/071144 on Jan. 22, 2014.

(51) Int. Cl.
| | |
|---|---|
| *B05D 1/12* | (2006.01) |
| *B05D 3/02* | (2006.01) |
| *B05D 5/12* | (2006.01) |
| *H05K 1/03* | (2006.01) |
| *H05K 1/09* | (2006.01) |
| *H01L 31/18* | (2006.01) |
| *H01L 31/0224* | (2006.01) |

(52) U.S. Cl.
CPC .............. *H05K 1/092* (2013.01); *B05D 1/12* (2013.01); *B05D 3/0254* (2013.01); *B05D 5/12* (2013.01); *G02F 2201/12* (2013.01); *G02F 2202/36* (2013.01); *G02F 2203/01* (2013.01); *H01L 31/022466* (2013.01); *H01L 31/1884* (2013.01); *H05K 1/0306* (2013.01); *H05K 2201/0108* (2013.01); *H05K 2201/026* (2013.01)

(58) Field of Classification Search
CPC ................. H05K 1/092; H05K 1/0306; H05K 2201/0108; H05K 2201/026; G02F 2201/12; G02F 2202/36; G02F 2203/01; B05D 1/12; B05D 3/0254; B05D 5/12; H01L 31/022466; H01L 31/1884
USPC ......................................................... 427/58
See application file for complete search history.

(56) References Cited

U.S. PATENT DOCUMENTS

| | | |
|---|---|---|
| 8,049,333 B2 | 11/2011 | Alden et al. |
| 2006/0257638 A1 | 11/2006 | Glatkowski et al. |
| 2009/0052029 A1 | 2/2009 | Dai |
| 2009/0129004 A1 | 5/2009 | Gruner |
| 2011/0285019 A1 | 11/2011 | Alden et al. |
| 2012/0119760 A1 | 5/2012 | Pehrsson et al. |

(Continued)

OTHER PUBLICATIONS

Lee, Jinhwan et al., "Very Long Ag Nanowire Synthesis and Its Application in a Highly Transparent, Conductive and Flexible Metal Electrode Touch Panel," Nanoscale, vol. 4, 2012, pp. 6408-6414.

*Primary Examiner* — Brian K Talbot
(74) *Attorney, Agent, or Firm* — Nixon & Vanderhye P.C.

(57) ABSTRACT

Transparent conductive electrodes comprising merged metal nanowires and the method of making the same are disclosed. The merged nanowire junctions have junction depth (J12) less than the combination of the diameters (d1, d2) of the individual metal nanowires.

4 Claims, 4 Drawing Sheets

Merged junctions, J12 < (d1+d2)

(56) References Cited

U.S. PATENT DOCUMENTS

| | | | |
|---|---|---|---|
| 2013/0342221 A1 | 12/2013 | Virkar | |
| 2014/0014171 A1* | 1/2014 | Alam | G02F 1/13439 136/256 |
| 2015/0144380 A1* | 5/2015 | Yang | H05K 1/097 174/253 |
| 2015/0206623 A1* | 7/2015 | Poon | H01B 1/02 427/123 |

* cited by examiner

Prior Art

Over pass junctions, J13 =(d1+d2+d3)

FIG. 5

Prior art: flattened cross points

FIG. 6

Merged junctions, J12 < (d1+d2)

FIG. 7

METHOD OF MAKING TRANSPARENT CONDUCTIVE ELECTRODES COMPRISING MERGED METAL NANOWIRES

CROSS-REFERENCES TO RELATED APPLICATIONS

This application is a continuation of U.S. patent application Ser. No. 14/360,896, filed Oct. 20, 2014, pending, which is the U.S. national phase of PCT International Patent Application No. PCT/CN2014/071144 filed Jan. 22, 2014, the entire contents of each of which are hereby incorporated by reference in this application.

STATEMENT REGARDING FEDERALLY SPONSORED RESEARCH OR DEVELOPMENT (Not Applicable)

TECHNICAL FIELD

This present patent application relates, in general, to the art of transparent electrodes, including their structures and method of making, and more particularly, to the art of fabricating transparent electrodes having a network of metal nanowires with merged junctions.

BACKGROUND OF THE INVENTION

Indium tin-oxide (ITO) is traditionally widely used as a transparent conductor in transparent electrodes in science and research community, but it also has well drawbacks in large scale manufacturing processes. First, in order to make electrodes, ITO is vacuum deposited onto substrates, and the vacuum deposition process is expensive and low throughput. Second, in most of applications, 150 nm or thicker of ITO is needed to ensure electrical performance, but at such thicknesses, ITO films become brittle making them not feasible for applications requiring large areas or flexible substrates. Third, to achieve good conductivity and clarity, ITO films need to be annealed at high temperatures, preferably over 200° C., thus limiting its application on high temperature resistant substrates such as glass. Due to the low softening point of polymers, most polymer based ITO films cannot withstand the annealing temperatures required for achieving the high conductivity and transparency at the same time. Therefore as electro-optical applications expand to more novel and exotic functionalities, such as 3-dimensional displays and solar cells, there is an increasing demand to invent alternative transparent electrodes with better than or comparable optical and electrical performance of ITO but suitable for large area flexible substrate and can be manufactured in an inexpensive high through manner.

Transparent conductive electrodes comprising printable metal nanowires have been successfully demonstrated as alternatives to be manufactured at low cost and on a large scale and with excellent performance including conductivity and transparency.

However the networked metal nanowires are not like the ITO films, having uniform conductivity across the entire film. The electrode having a plurality of metal nanowires, have areas containing metal nanowires laying on top of each other or crossing over. Research has found that reducing the metal nanowire junctions can significant reduce the sheet resistance of the conductive film.

Figure 1:
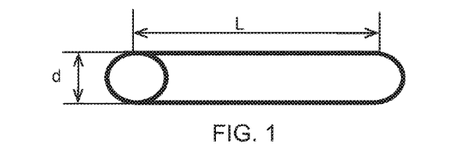
FIG. 1 diagrammatically illustrates a cross-section view of a metal nanowire.
Figure 5:
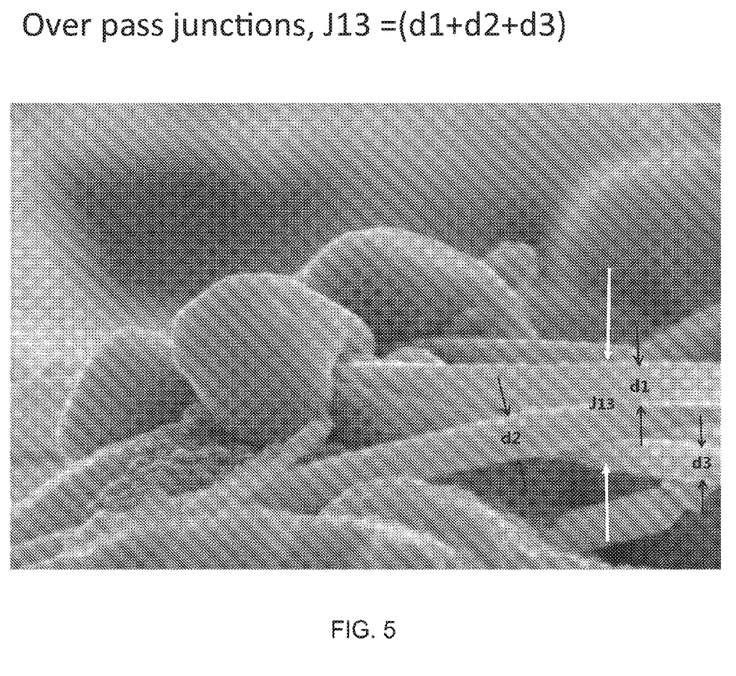
FIG. 5 is an SEM image of the cross-section view of a conductive transparent electrode, wherein three metal nanowires lay on top of one another.

Normally, when two nanowires stack together, it results in an intersection, having a height equal to the combined heights, i.e., diameters, of the two nanowires. For example, a conductive metal nanowire network comprises a first metal nanowire, having a diameter of d1, and a second metal nanowire, having a diameter of d2, and in the metal nanowire network, the first and second metal nanowire cross over to form a junction, then the junction height (J12) equals to d1+d2. FIG. 5 shows another example, a conductive electrode comprises a plurality of metal nanowires, the networked metal nanowires have a first metal nanowire with a diameter of d1, a second metal nanowire with a diameter of d2, and a third metal nanowire with a diameter of d3. In the metal nanowire network, the first, second and third metal nanowire cross over to form a junction, then the junction height J13 equals to the total height (i.e., diameter) of each metal nanowire, which is J13=d1+d2+d3. In FIG. 1, the first, second and third metal nanowire all have the same diameter (d1=d2=d3=d) and the junction height J13 equals to 3d.

Research has found that high temperature annealing alone is not effective in melting the metal nanowire junction in order to reduce the sheet resistance. For example, anneal the dry film at a process condition 150-200° C., does not change the junction that has been formed, the sheet resistance of conductive film remains as high as over 1000 Ohms.

Approaches that have proven to be useful to change the nanowire junction is either to glue two wires together with a conductive polymer, as what has been taught in the art of carbon nanotubes, or using a high pressure press to flattened the junctions, as taught by U.S. Publication No. 2011/0285019 and U.S. Pat. No. 8,049,333 in Cambrios patents. In U.S. Publication No. 2011/0285019 and U.S. Pat. No. 8,049,333, external macroscopic force such as high pressure is used to flatten the junction to achieve the reduction in sheet resistance, in addition to high temperature annealing. However, the process introduces defects. Because nanowires are susceptible to damages, including physical deformation and/or thermal oxidation under high temperature and high-pressure process. Also the process using external force pressing the nanowires together is applied to the entire film, not only to the metal nanowire junction. Given the tiny dimension of nanowires, it requires very smooth and flat substrate surface to ensure the applied forces act on the junction. Otherwise, it is very likely that the nanowire length besides the junction is also pressed to be deformed or flattened, causing unnecessary stability issues.

In view of the foregoing, a better method to connect nanowires at the cross over points is needed.

The present invention discloses an improved way to integrate nanowires at cross points to form merged junctions, in order to achieve low sheet resistance of a transparent conductive electrode. The method disclosed herein does not require high temperature, high pressure, and does not result in deformed metal nanowires.

BRIEF SUMMARY OF THE INVENTION

The present invention discloses a transparent conductive electrode comprising a substrate; and a substantial single layer on the substrate, comprising a first metal nanowire, having a diameter of d1, and a second metal nanowire, having a diameter of d2, wherein the first and second metal nanowires meet to form a merged junction, having a depth of J12, wherein J12<(d1+d2), J12>d1, and J12>d2.

The present invention also discloses a method of making a transparent conductive electrode, comprising a plurality of metal nanowires in a network, said network comprises merged metal nanowire junctions, the method comprising
providing a substrate; and forming a substantial single layer comprising metal nanowire network on the substrate; and forming merged metal nanowire junctions between neighboring metal nanowires.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE INVENTION

Hereinafter, selected examples of a transparent conductive electrode will be discussed with reference to the accompanying drawings. It will be appreciated by those skilled in the art that the following discussion is for demonstration purposes, and should not be interpreted as a limitation. Other variances within the scope of this disclosure are also applicable.

"Optional" or "optionally" means that the subsequently described circumstance may or may not occur, so that the description includes instances where the circumstance occurs and instances where it does not.

In the scope of the present invention, in some instances, "top" means situated at the highest position in a figure or a stack. "Top view" means what an observer sees looking down at the top. In some instances, bottom electrode means a device is built from it whereas a top electrode means an electrode situated on top of the device stack.

Single Layer

In one embodiment of the present invention, the transparent conductive electrode (TCE) comprises a substrate and a single conductive layer, comprising nanowires. Optionally, the conductive layer further comprises a diffused conductive material, for example ITO. Optionally, the conductive layer further comprises a matrix, comprising conductive or non-conductive polymers. "Matrix" refers to a solid-state material into which the metal nanowires are dispersed or embedded. Portions of the nanowires may protrude from the matrix material to enable access to the conductive network. The matrix may be a host for the metal nanowires and provides a physical form of the conductive layer. The matrix may protect the metal nanowires from adverse environmental factors, such as corrosion and abrasion. In addition, the matrix may offer favorable physical and mechanical properties to the conductive layer. For example, it can provide adhesion to the substrate. In one example, the matrix is organic material, which offers a flexible matrix, compatible with a polymeric substrate. In another example, the matrix is metal oxide film, which is more compatible with glass substrate. The matrix may be refractive index matching layer. The matrix may offer anti-reflection and antiglare property to the transparent conductive electrode.

As used herein, "a single layer" or "a substantial single layer" is generally less than 150 nm, which is about three-nanowire thickness. More typically, "a single layer" or "a substantial single layer" is generally less than 100 nm, two-nanowire thickness. Preferably, "a single layer" or "a substantial single layer" is generally 50 nm or less, one nanowire thickness. In various embodiments, the width or diameter of the nanowires are in the range of 10 to 40 nm, 20 to 40 nm, 5 to 20 nm, 10 to 30 nm, 40 to 60 nm, 50 to 70 nm.

Nanowires

In accordance with the aspects with the present invention, nanowires have a cylindrical shaped, having a diameter d and length L as shown in FIG. 1. The aspect ratios of nanowires are L/d. Suitable aspect ratios of the nanowires are between 10 to 100,000. In one preferred example, the aspect ratios of the nanowires are more than 1000, in order to provide a transparent conductive film, because longer and thinner nanowires may enable more efficient conductive networks while permitting lower overall density of wires for achieving a higher transparency.

Metal Nanowires

As know in the art, conductive nanowires include metal nanowires and non-metallic nanowires. In general, "metal nanowire" refers to a metallic wire comprising element metal and metal alloys. Non-metallic nanowires include, for example, carbon nanotubes (CNTs), conductive polymer fibers and the like.

In accordance with the aspects of the present invention, metal nanowires refers to substantially elemental metal and metal alloys. Optionally, the metal nanowires may have less than 5-10% (by moles) of metal oxides. Metal oxides may exist in the metal nanowire shell or core as an impurity or defect in the nanowire synthesis.

In accordance with the aspects of the present invention, metal oxide nanowires refers to the nanowires are substantially metal oxides. Optionally, metal oxide nanowires may have less than 5-10% (by moles) of elemental metal, due to incomplete oxidation or any other reasons.

In accordance with the aspects of the present invention, hybrid nanowires are metal/metal oxide nanowires, wherein the nanowires, having both elemental metal and metal oxides as major components. Metal/metal oxide hybrid nanowires may comprise 40% (mole %) metal oxide and 60% (mole %) elemental metal. Metal/metal oxide hybrid nanowires may comprise 60% (mole %) metal oxide and 40% (mole %) elemental metal.

Conductivity of Metal Nanowire

A single metal nanowire has to extend between two different electrical terminals to provide an electrically conductive path from one terminal to terminal. The term 'terminal' includes cathode or anode or any other starting and ending points that are electrically connected. Generally, the longer the metal nanowire the longer the conductive pathway, the more conductive the conductive electrode and lower the sheet resistance. The more metal nanowires in a given area, the lower the sheet resistance of the conductive electrode. In order to achieve both highly conductive electrode and highly transparent film, the metal nanowires are preferred to be long and thin.

However, making a conductive film having super long and thin is not only experimentally challenging, but can lead to brittle films. In the conductive layer of the electrode of the present invention, a plurality of metal nanowires in conductive layer forms a network. In the network, one nanowire can be related to a neighboring nanowire through entanglement or loosely crossing over. When a nanowire is related to another nanowire in proximity, a charge may or may not be able to hop from one nanowire to another. In the network, one nanowire can be connected to a neighboring nanowire through crossing over. When one nanowire connects to another nanowire, a connecting junction is formed and the conductive pathways provided by both nanowires are interconnected.

Over Pass Junctions, Flattened Junctions Vs. Merged Junctions

Figure 2:
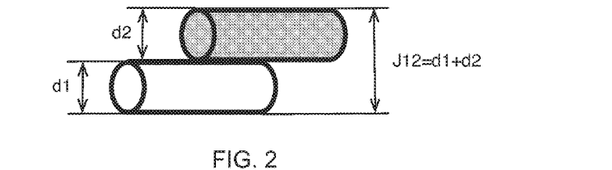
FIG. 2 diagrammatically illustrates a cross-sectional view of one example of two metal nanowires meets to form a cross section.
Figure 6:
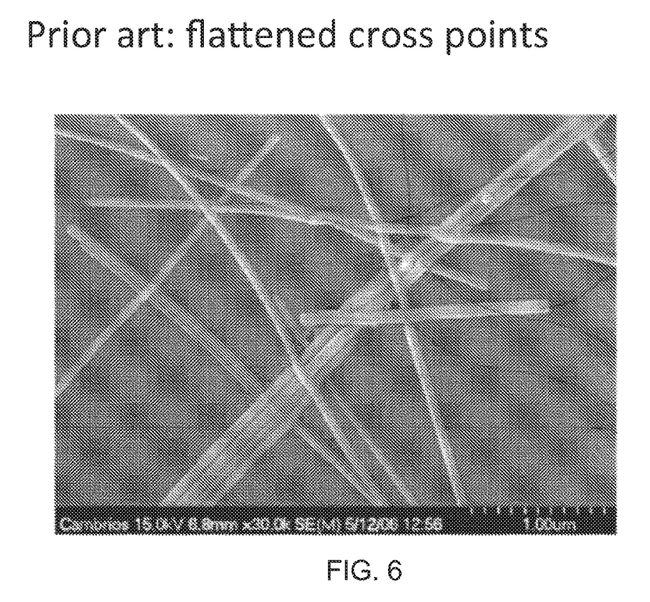
FIG. 6 shows an SEM image of a conductive layer following a post-treatment of pressure application, wherein cross points has a flattened cross section as in the prior art.

FIG. 2 and FIG. 5 list examples of over pass junctions. FIGS. 3-4b, and FIG. 7 illustrate examples of merged junctions. FIG. 6 is an SEM image from U.S. Publication No. 2011/0285019 illustrating flattened junctions.

Figure 3:
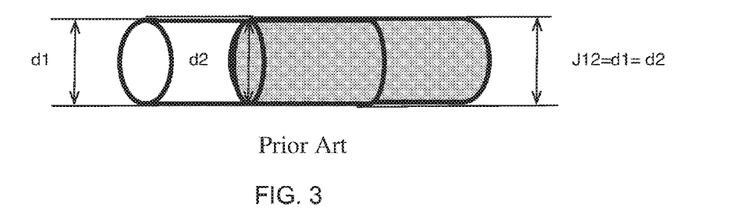
FIG. 3 diagrammatically illustrates a cross-sectional view of one example of two metal nanowires meets to form a flattened cross section in the prior art.
Figure 4A:
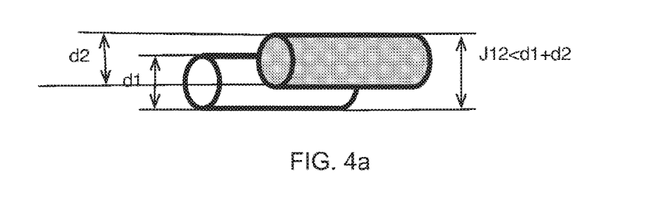
FIGS. 4a-b diagrammatically illustrates a cross-sectional view of one example of two metal nanowires meets to form merged junction in the present invention.
Figure 4B:
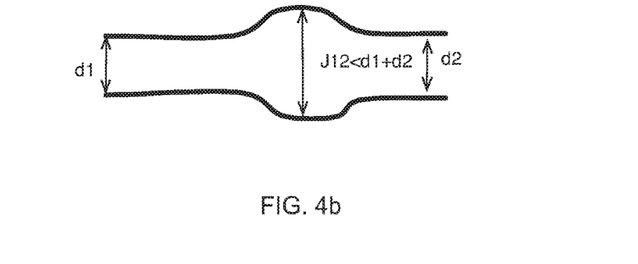

FIGS. 2-4b schematically illustrate three examples of metal nanowire connecting junctions. FIG. 2 illustrates a first kind connecting junction is an over pass junction, wherein the one nanowire is laid over the other nanowire and there is no space or matrix material between the two nanowires. The two nanowire forms a close interface at the junction, but most of the metal nanowires are substantially separate from each other. FIG. 3 illustrates a second kind of connecting junction, a flat junction, wherein the cross point between the two nanowires are flat. FIGS. 4a and 4b illustrate a third connecting junction, a merged junction, wherein one nanowire cross over another nanowire, at least some part of the nanowire is merged into each other.

The present invention is directed to a conductive electrode, comprising a substrate and a substantially a single conductive layer. The conductive layer comprises a plurality of metal nanowires networked together. The plurality of metal nanowires are linked to each other at various points to provide a conductive pathways from one terminal to another. The plurality nanowires comprises a first nanowire and a second nanowire network together. In the conductive nanowire network, the first nanowire is related to the second nanowire. In the conductive nanowire network, the first nanowire is connected to the second network. When the first nanowire is connected to a second nanowire, the conductive pathways are linked, fused, or merged together. The first nanowire has a diameter of d1. The second nanowire has a diameter of d2. The height of the junction, which is the distance from the external boundary of one nanowire to the external boundary of the other nanowire, is J12. In the network, when the first nanowire is related to the second nanowire, the value of J12 is larger than the combination of (d1+d2). In the network, when the first nanowire is connected or linked with the second nanowire, the value of J12 is equal to or greater than the diameter of the individual nanowires, but less than the combination of the diameters of the individual nanowires (d1+d2).

U.S. Publication No. 2011/0285019 and U.S. Pat. No. 8,049,333 taught flat or flattened cross points. The junction or crossing points are flattened by pressure or high temperature in order to reduce the sheet resistance of electrode. In accordance with the aspects of U.S. Publication No. 2011/0285019 and U.S. Pat. No. 8,049,333, the cross points or junction of two crossing over nanowires have to pressed by pressure, to physically deform the metal nanowire macroscopically, to achieve a flat cross point.

Further, the method taught by U.S. Publication No. 2011/0285019 and U.S. Pat. No. 8,049,333, rolling the transparent conductive electrode under a roller to flatten the junction is subject to the surface roughness of the substrate. Using an external press to flatten junction the pressure is counteracted by the surface roughness of press roll and the substrate and the conformal contact between two surfaces is hard to control.

In contrast, the present invention presents an electrode having low sheet resistance by comprising nanowire junctions having merged junctions, wherein the merged junctions do not have deformed/flattened surfaces. Further, one nanowire merged into another nanowire without the application of pressure.

The method of making a transparent conductive electrode, disclosed herein, comprises providing a substrate; and forming a substantial single layer comprising metal nanowire network on the substrate, comprising forming merged metal nanowire junctions between neighboring metal nanowires.

The method of forming merged metal nanowire junctions between neighboring metal nanowires comprises inducing liquid phase sintering of two nanowires at the cylindrical curvature.

The method of forming merged metal nanowire junctions between neighboring metal nanowires further comprise carefully controlling the drying atmosphere, surface tension, and the capillary pressure at junction curvature by continuous dissolving and re-precipitation of silver atoms at the nanowire cross point.

The method describes herein utilizes inter-particle forces, which are much more significant, an order magnitude higher, and effective than macroscopic forces such as high press rolls to flatten the metal nanowires. Additionally, the microscopic forces focus action on the intersection/cross over points only and are completely independent from the substrate curvature or the surface roughness of the substrate.

In one embodiment of the present invention, the method step forming merged nanowire junctions comprises preparing an ink solution comprising metal nanowires in a first solvent, forming a metal nanowire network comprising crossing points on the substrate, removing the first solvent by drying to form a film of nanowires, placing the nanowire film under the atmosphere saturate with a second solvent, controlling the continuous dissolving and re-precipitation process of the metal nanowire at the cross point and drying the film to form a conductive film. In one example, the first solvent and second solvent is the same solvent. In another example, the second solvent is a combination of two solvents.

In another embodiment of the present invention, the method step forming merged nanowire junctions comprises preparing an ink solution comprising metal nanowires in a first solvent, forming a metal nanowire network comprising crossing points on the substrate, forming merged metal nanowire junctions by reducing the evaporation rate of the first solvent at a first temperature, annealing the film having merged metal nanowire junctions at a second temperature.

Coating Methods

As noted herein, the transparent conductors can be fabricated by, for example, sheet coating, web-coating, printing, and lamination. Sheet coating is suitable for coating a conductive layer on any substrate, in particular, rigid substrates. Web-coating has been employed in the textile and paper industries for high-speed (high-throughput) coating applications. It is compatible with the deposition (coating)

processes for transparent conductor fabrication. Web-coating uses conventional equipment and can be fully automated, which dramatically reduces the cost of fabricating transparent conductors. In particular, web-coating produces uniform and reproducible conductive layers on flexible substrates. Process steps can be run on a fully integrated line or serially as separate operations. Further details on the wet-coating techniques and procedures disclosed by U.S. Publication No. 2011/0285019 can also be adopted in the present invention.

Optionally, the first metal nanowire network comprising cross points can be deposited onto the substrate by other methods than wet-coating and the merge junctions can be formed in the solvent based atmosphere by controlling the dissolving and re-precipitation process at the crossing over points or junctions.

Size of Nanowires

In one aspect of the present invention, in one example, the metal nanowires in the network, or in the merged junction have substantially the same diameters. Then the junction height J12 of the merged junction between the first and second nanowires, having diameters d1 and d2 respectively, J12<2d1=2d2.

Transparency

With preferred thicknesses of the substantial single layer of the networked metal nanowire, the transparent conductive electrode provides excellent optical transparency. In one example, the transparent conductive electrode has at least >80% optical transmittance in the wavelength of 400-1000 nm. In a preferred example, the transparent conductive electrode has at least >90% optical transmittance in the wavelength range of 400-1000 nm. In a more preferred example, the transparent conductive electrode has at least >95% optical transmittance from wavelengths of 400-1000 nm.

The haze value of the transparent conductive electrode in the present invention are tunable from >10% to <0.6%, depending on the end use application. In one example of the present invention, the haze of the transparent conductive electrode is >10%. In another example of the present invention, the haze of the transparent conductive electrode is <0.6%. In one example, the super low haze of the film is achieved by tuning the aspect ratio of the metal nanowires. In another example, the super low haze is accomplished by employing index matching materials as a matrix. In still another example, the super low haze is accomplished by using index matching as a separate layer.

Conductivity

The transparent conductive electrode in the present invention is invented for electrical-optical devices. The single conductive layer design and the merged junction in the networks are devised to improve the conductivity in both the in-plane and off-plane direction. As a result, the sheet resistance of the conductive film is greatly reduced. In one example, the transparent conductive electrode has an electrical resistance of about 200 ohms per square or less. In another example, the transparent conductive electrode has an electrical resistance of about 300 ohms per square or less. In another embodiment of the present invention, the metal nanowire network has a sheet resistance tunable from 0.1 Ohm/sq to 1000 Ohm/sq.

Nanowire Chemical Composition

In the present invention, nanowires may be comprised of one or more materials selected from a variety of electrically conductive materials, any noble elements etc. Elements in the period table that can be used as the chemical composition for metal nanowires include, but not limited to, copper (Cu), silver (Ag), gold (Au), aluminum (Al), nickel (Ni), lead (Pb), platinum (Pt) or combinations thereof. The metals that can be used in the nanowire network can further include a silver plated copper, a gold plated silver, or a gold plated copper. The nanowires may also be comprised of one or more materials, such as but not limited to, Zn, Mo, Cr, W, Ta, metallic alloys, or the like. In the present invention, some less preferred examples include nanowires comprising metal oxides.

In one example of the present invention, the metal nanowire network consists of only one chemical composition throughout. In another example of the present invention, the metal nanowire network consists of a mixture of chemical compositions. In one instance, said mixture of chemical compositions includes metals or metal oxides. In another instance, said mixture of chemical compositions includes chemical compounds with different electrical properties, such as electrical conductivity. In another instance, said mixture of chemical compositions includes chemical compounds with different optical properties, such as optical transparency or refractive index.

In one example of the present invention, the nanowire may further comprise an anticorrosion coating or anti-reflective coating.

Shape or Geometry

In the aforementioned instances, examples or embodiments of the present invention disclosed herein, the nanowires are described as having at least an end or a length. This description is used primarily for the ease of discussion; it should be understood that any geometric shapes such as rods of different aspect ratios, dog-bone shapes, round particles, oblong particles, single or multiple combinations of different geometric shapes, or other particle configurations capable of forming a metal network may be used herein.

Substrate

In one example of the present invention, the substrate is a rigid substrate. The rigid substrate is a glass. In some instances, the glass has refractive index of more than 1.5. In some instances, the glass has a refractive index of more than 1.7.

In another example of the present invention, the substrate is a flexible substrate comprising a polymer. Examples of such a polymer includes, but not limited to, a polyimides (PI), polyamides, polyetheretherketone (PEEK), Polyethersulfone (PES), polyetherimide (PEI), polyethylene naphtalate (PEN), Polyester (PET), related polymers, a metallized plastic, and/or combination of the above and/or similar materials.

In a more preferred example, the polymer substrate has barrier properties. In one instances, the substrate is a piece of barrier film having oxygen permeation rate less than 10-2 g/m2/day. In another instance, the substrate is a piece of barrier film having moisture permeation rate less than 10-2 g/m2/day. In still another instance, the substrate is a piece of barrier film having moisture permeation rate less than 10-6 g/m2/day.

In still another example, the substrate is a curved or flexible substrate.

In yet another example, the substrate has regular geometries. Such geometries include the geometries of cell phones, tablets, TVs, e-books, windows and solar cells. In yet another example, the substrate has irregular geometries, including stars, pyramids and spheres etc.

Location of the Electrode in a Device

The transparent conductive electrode in the present invention is ultimately used in electrical optical device. Optical properties such as transparency and electrical properties like conductivity make the transparent conductive electrode in the present invention suitable for a wide range of the applications. In one example, the transparent electrode is a top electrode in a device. In another example, the electrode is a bottom electrode of a device. In still another example, the electrode of is an electrode is of a stacked device.

Method

In one aspect, the present invention also discloses a method of making a transparent conductive electrode, comprising a plurality of metal nanowires in a network, said network comprises merged metal nanowire junctions. The method comprising providing a substrate; and forming a substantial single layer comprising metal nanowire network on the substrate; and forming merged metal nanowire junctions between neighboring metal nanowires.

In one embodiment, the method of forming a substantial single layer of transparent conductive electrode, comprises preparing an ink solution by mixing nanowires in water, in the presence of a surfactant;

coating the ink solution onto the substrate to form a coated film;

drying the coated film in the ambient environment; and anneal the film at a temperature between 80-150° C.

The method further comprises a step of placing the film in an acidic environment.

Subsequently, the method further comprises a step of placing the film in a basic environment.

In another embodiment, the method of forming a substantial single layer of transparent conductive electrode, comprises preparing an ink solution by mixing nanowires in water, in the presence of a surfactant;

coating the ink solution onto the substrate to form a coated film;

placing the coated film in an acid environment before the removal of the solvent in the coated film; and anneal the coated film at a temperature between 80-150° C.

Preferably, the method further comprises placing the coated film in a basic environment after the placing the coated film in an acid environment.

Acidic environment includes all the chemical environments, which are able to convert metals from elemental states to their oxidation states and be soluble in a solvent or a mixture of solvents. In one example, the metal nanowire in the transparent electrode is silver, the solvent used for prepare the ink solution is water and the acid environment comprises acids, including acetic acid, formic acid and combinations thereof. Optionally, the ink solution comprises binders such as cellulose. Optionally, the ink solution comprises an alcohol as the solvent. Optionally, the ink solution comprises a water and alcohol mixture as the solvent. Optionally, the acidic environment comprises more than one acids, at least one acid is an organic acid.

Basic environment includes all the chemical environments, which are able to convert metals in their oxidation or salt states into elemental states. In one example, the metal nanowire in the transparent electrode is silver, the solvent used for prepare the ink solution is water, and the basic environment comprises ammonia and water. Optionally, the ink solution comprises binders such as cellulose. Optionally, the ink solution comprises an alcohol as the solvent. Optionally, the ink solution comprises a water and alcohol mixture as the solvent. Optionally, the basic environment comprises more than one base, and at least one base is an organic base.

The present invention also discloses a method of making a transparent conductive electrode, comprising a plurality of metal nanowires in a network, said network comprises merged metal nanowire junctions. The method comprising providing a substrate; and forming a substantial single layer comprising metal nanowire network on the substrate; and forming merged metal nanowire junctions between neighboring metal nanowires.

In another aspect, the present invention discloses a method of making a transparent conductive electrode, comprising a plurality of metal nanowires in a network, said network comprises merged metal nanowire junctions. The method comprising providing a substrate; and forming a substantial single layer comprising metal nanowire network on the substrate; and forming metal nanowire junctions using liquid phase sintering process.

The liquid phase sintering process comprises a key step, solution-re-precipitation step, wherein some elemental metals are converted into salts and dissolved, and some dissolved metal salts precipitate out to form metal powders. The liquid sintering process further comprises sintering the metal powders into the metal nanowires.

The liquid phase sintering is a diffusion-controlled process.

Optionally, the liquid phase sintering further comprises rearranging the metal nanowires.

EXPERIMENTAL

Comparative Experiment:

A formulation of silver nanowire was prepared by mixing 0.3 g of nanowires, 99.6 g of water, 0.1 g of cellulose, and 0.01 g of surfactants. The solution was then spun coated on a PET substrate at 800 rpm for 30 s and let dry in the air under room temperature for 10 minutes. This was then further heat dried in an oven at 120° C. for another 3 minutes. The sheet resistance of as prepared sample remains >50K Ohm/sq, and the SEM picture of wire-to-wire intersection is shown in FIG. 5.

Experimental Procedures to Induce Liquid Phase Sintering

Figure 7:
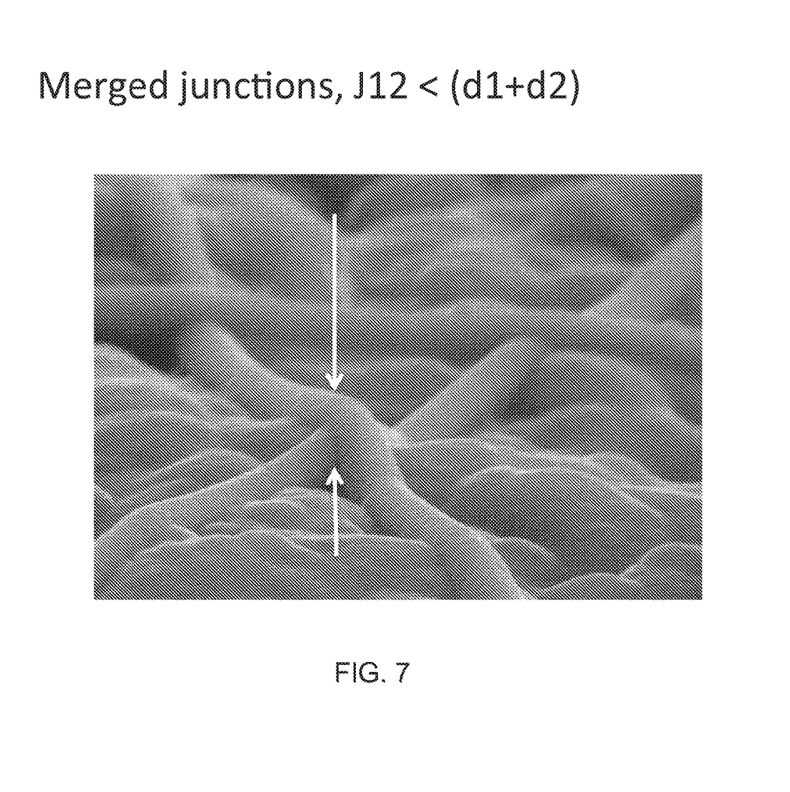
FIG. 7 shows an SEM image of a conductive layer comprising metal nanowire merged junctions, wherein the depth of the junction is less than the combination of the two individual diameters.

A formulation of silver nanowire was prepared by mixing 0.3 g of nanowires, 99.6 g of water, 0.1 g of cellulose, and 0.01 g of surfactants. The solution was spun coated on a PET substrate at 800 rpm for 30 s. Instead of drying in air at room temperature, it was moved into an acidic atmosphere saturated with both mixture of acetic and formic acids vapor for 30 s-3 minutes, this is then moved into a basic atmosphere containing ammonia and water vapor for 5 minutes. This is then followed with a further bake at temperature of 120° C. for 3 minutes. The sheet resistance of the sample was measured to be ~100 Ohm/sq. The SEM picture of wire-to-wire intersection is shown in FIG. 7.

It will be appreciated by those skilled in the art that the above discussion is for demonstration purpose; and the examples discussed above are some of many possible examples. Other variations are also applicable.

Any reference in this specification to "one embodiment," :an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

Although few embodiments of the present invention have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including," derivatives thereof and similar transitional terms or phrases are used synonymously with "comprising" (i.e., all are considered "open ended" terms)—only the phrases "consisting of" and "consisting essentially of" should be considered as "close ended." Claims are not intended to be interpreted under 112 sixth paragraph unless the phrase "means for" and an associated function appear in a claim and the claim fails to recite sufficient structure to perform such function.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A method of making a transparent conductive electrode, comprising:
   providing a substrate;
   forming a substantial single layer comprising a metal nanowire network which comprises a plurality of intersection points on the substrate; and
   forming metal nanowire junctions using a liquid phase sintering process,
   wherein forming a substantial single layer comprising a metal nanowire network which comprises a plurality of intersection points on the substrate comprises:
      preparing an ink solution comprising metal nanowires in a first solvent,
      applying the ink solution onto the substrate to form a coated film,
      before the removal of the solvent in the coated film, placing the coated film in an acid environment and then in a basic environment, and
      annealing the coated film at a temperature between 80° C. and 150° C.

2. The method according to claim 1, wherein the liquid phase sintering process is performed on two or more nanowires of the metal nanowire network at the cylindrical curvature.

3. The method according to claim 1, wherein forming metal nanowire junctions using a liquid phase sintering process comprises:
   placing the substantial single layer under an atmosphere saturate with a second solvent,
   controlling a continuous dissolving and re-precipitation process of the metal nanowire at the cross point, and
   drying the substantial single layer to form a conductive film.

4. The method according to claim 1, wherein forming metal nanowire junctions using a liquid phase sintering process comprises:
   forming merged metal nanowire junctions by reducing the evaporation rate of the first solvent at a first temperature, and
   annealing the film having the merged metal nanowire junctions at a second temperature.

* * * * *